United States Patent
Su et al.

(10) Patent No.: US 12,519,431 B2
(45) Date of Patent: Jan. 6, 2026

(54) RECONFIGURABLE HIGH-INTEGRATION RADIO-FREQUENCY AMPLIFIER AND CHIP

(71) Applicant: SMARTER MICROELECTRONICS (GUANG ZHOU) CO., LTD., Guangzhou (CN)

(72) Inventors: Qiang Su, Guangzhou (CN); Yongle Li, Guangzhou (CN); Limin Yu, Guangzhou (CN); Baiming Xu, Guangzhou (CN)

(73) Assignee: SMARTER MICROELECTRONICS (GUANG ZHOU) CO., LTD., Guangzhou (CN)

( * ) Notice: Subject to any disclaimer, the term of this patent is extended or adjusted under 35 U.S.C. 154(b) by 704 days.

(21) Appl. No.: 17/929,699

(22) Filed: Sep. 3, 2022

(65) Prior Publication Data

US 2023/0006618 A1  Jan. 5, 2023

Related U.S. Application Data

(63) Continuation of application No. PCT/CN2021/136085, filed on Dec. 7, 2021.

(51) Int. Cl.
*H03F 3/195* (2006.01)
*H03F 1/56* (2006.01)

(52) U.S. Cl.
CPC .............. *H03F 3/195* (2013.01); *H03F 1/565* (2013.01); *H03F 2200/222* (2013.01); *H03F 2200/451* (2013.01)

(58) Field of Classification Search
CPC .... H03F 3/195; H03F 1/565; H03F 2200/222; H03F 2200/451; H03F 1/223;
(Continued)

(56) References Cited

U.S. PATENT DOCUMENTS 6,781,455 B2 * 8/2004 Kim ......................... H03F 1/56
330/51
10,992,268 B2 * 4/2021 Wong .................... H03F 1/0222
(Continued)

FOREIGN PATENT DOCUMENTS

| CN | 106953604 A | 7/2017 |
| CN | 111082758 A | 4/2020 |

(Continued)

OTHER PUBLICATIONS

International Search Report in Application No. PCT/CN2021/136085, mailed on Feb. 24, 2022.
(Continued)

*Primary Examiner* — Andrea Lindgren Baltzell
*Assistant Examiner* — Khiem D Nguyen
(74) *Attorney, Agent, or Firm* — Syncoda LLC; Feng Ma

(57) ABSTRACT

When a signal source sends a radio-frequency signal to an input amplification circuit, a control circuit sends a first control signal to the input amplification circuit according to the frequency of the radio-frequency signal, the input amplification circuit receives the first control signal and forms an input oscillation loop, the radio-frequency signal forms an amplified first signal through the input oscillation loop, and the input amplification circuit sends the first signal to the output amplification circuit. According to the frequency of the radio-frequency signal, the control circuit transmits a second control signal to the output amplification circuit, which forms an output oscillation loop matched with the first signal. The first signal is amplified by the output oscillation loop to form an emitting signal, the output amplification circuit transmits the emitting signal to the emitting antenna for emitting, thereby improving the utilization ratio of a radio-frequency front end chip package.

10 Claims, 8 Drawing Sheets

(58) Field of Classification Search
CPC .... H03F 1/342; H03F 2200/411; H03F 3/211; H03F 3/245
USPC ........................................................ 330/291
See application file for complete search history.

(56) References Cited

U.S. PATENT DOCUMENTS

2015/0188500 A1* 7/2015 Kang ..................... H03F 1/223
                                                           330/293
2016/0190996 A1* 6/2016 Searle .................... H03F 3/211
                                                           330/295

FOREIGN PATENT DOCUMENTS

| CN | 111293999 A | 6/2020 |
| CN | 112688644 A | 4/2021 |

OTHER PUBLICATIONS

China first office action in Application No. 202110263967.9, mailed on May 6, 2021.
China second office action in Application No. 202110263967.9, mailed on Jun. 7, 2021.
Cheng Yuandong et al.: communication electronics, Jan. 31, 2011, www.buptpress.com.

* cited by examiner

RECONFIGURABLE HIGH-INTEGRATION RADIO-FREQUENCY AMPLIFIER AND CHIP

CROSS-REFERENCE TO RELATED APPLICATIONS

This is a continuation of International Application No. PCT/CN2021/136085 filed on Dec. 7, 2021, which claims priority to Chinese Patent Application No. 202110263967.9 filed on Mar. 11, 2021. The disclosures of the above-referenced applications are hereby incorporated by reference in their entirety.

BACKGROUND

A radio-frequency front end system usually includes a power amplification chip, a power source and logic control chip, a radio-frequency switch chip and a passive network (including a filter, a coupler, etc.). The power amplification chip is used to amplify different frequencies of signals, and the power logic control chip is used to control the working state of the power amplification chip, and the radio frequency switch is used to switch different channels, and the passive network is used to provide filtering, impedance matching and other functions.

SUMMARY

The embodiments of the disclosure relate to the technical field of radio frequency, in particular to a reconfigurable high-integration radio-frequency amplifier and a chip.

An embodiment of the disclosure provides a reconfigurable high-integration radio-frequency amplifier and a chip, which can effectively reduce the area of a radio-frequency front end chip, thereby improving the utilization rate of a radio-frequency front end chip package.

An embodiment of the disclosure provides the reconfigurable high-integration radio-frequency amplifier, which includes a signal source, a control circuit, an input amplification circuit, an output amplification circuit and an emitting antenna.

A first end of the input amplification circuit is connected to the signal source, and a second end of the input amplification circuit is connected to a first end of the output amplification circuit, and a second end of the output amplification circuit is connected to the emitting antenna, and one end of the control circuit is connected to a third end of the input amplification circuit and a third end of the output amplification circuit.

When the signal source transmits a radio-frequency signal to the input amplification circuit, the control circuit transmits a first control signal to the input amplification circuit according to a frequency of the radio-frequency signal, and the input amplification circuit forms an input oscillation loop matched with the radio-frequency signal under an action of the first control signal, and the radio-frequency signal forms an amplified first signal through the input oscillation loop, and the input amplification circuit transmits the first signal to the output amplification circuit; and the control circuit transmits a second control signal to the output amplification circuit according to the frequency of the radio-frequency signal, and the output amplification circuit forms an output oscillation loop matched with the first signal under an action of the second control signal, and the first signal is amplified through the output oscillation loop to form an emitting signal, and the output amplification circuit transmits the emitting signal to the emitting antenna for emitting.

In the above scheme, the input amplification circuit includes an input matching circuit and an intermediate amplification circuit, and the first control signal includes an input control signal and an intermediate amplification control signal, and a first end of the input matching circuit is connected to the signal source, and a second end of the input matching circuit is connected to a first end of the intermediate amplification circuit, and a second end of the intermediate amplification circuit is connected to the first end of the output amplification circuit.

One end of the control circuit is connected to a third end of the input matching circuit and a third end of the intermediate amplification circuit.

When the signal source transmits the radio-frequency signal to the input matching circuit, the control circuit acquires a behavior signal of a target object of the reconfigurable high-integration radio-frequency amplifier, and the control circuit transmits the input control signal to the input matching circuit based on the behavior signal, and the input matching circuit forms the input oscillation loop matched with the radio-frequency signal under an action of the input control signal.

The radio-frequency signal forms oscillation through the input oscillation loop, and then forms a first matching signal, and the first matching signal is transmitted to the intermediate amplification circuit.

Based on the behavior signal, the control circuit sends the intermediate amplification control signal to the intermediate amplification circuit, and the intermediate amplification circuit amplifies the first matching signal to form the first signal under an action of the intermediate amplification control signal, and the first signal is transmitted to the output amplification circuit.

In the above scheme, the input matching circuit includes m field effect transistors, m inductors and a first capacitor, and m is a positive integer greater than 1.

The m inductors are connected in series successively, and first ends of the m field effect transistors are connected to the signal source respectively, and a second end of the m field effect transistors is connected to a first end of the m inductors, and a second end of an (i)-th inductor is connected to a second end of an (i+1)-th field effect transistor, and a second end of the m-th inductor is connected to a first end of the first capacitor, and a second end of the first capacitor is connected to the first end of the intermediate amplification circuit, and i is a positive integer greater than or equal to 1 and less than m.

Third ends of the m field effect transistors are connected to one end of the control circuit respectively.

When the signal source transmits the radio-frequency signal to the input matching circuit, the control circuit transmits the input control signal to an n-th field effect transistor.

The n-th field effect transistor is turned on under the action of the input control signal, and forms the input oscillation loop including the n-th field effect transistor, m-n+1 inductors and the first capacitor.

The radio-frequency signal flows through the input oscillation loop and forms the first matching signal, and the first matching signal is transmitted to the intermediate amplification circuit, and n is a positive integer greater than or equal to 1 and less than or equal to m.

In the above scheme, the intermediate amplification circuit includes an intermediate amplifier and a feedback circuit.

A first end of the intermediate amplifier is grounded, and a third end of the intermediate amplifier is connected to a first end of the feedback circuit and then connected to the second end of the input matching circuit, and a second end of the feedback circuit is connected to a second end of the intermediate amplifier, and the second end of the intermediate amplifier is connected to the first end of the output amplification circuit.

A third end of the feedback circuit is connected to one end of the control circuit.

The first matching signal is shunted at the junction of the intermediate amplifier and the feedback circuit, forming an amplified matching signal and a feedback matching signal, and the amplified matching signal is transmitted to the third end of the intermediate amplifier for amplification to form the first signal, and the first signal is transmitted to the output amplification circuit, and the feedback matching signal is transmitted to the first end of the feedback circuit.

The control circuit transmits the intermediate amplification control signal to the third end of the feedback circuit, and the feedback circuit converts the feedback matching signal into a negative feedback signal under the action of the intermediate amplification control signal, and the negative feedback signal and the first matching signal are matched and cancelled.

In the above scheme, the feedback circuit includes a second capacitor, h resistors and 2(h−1) field effect transistors, and h is a positive integer greater than 1.

The h resistors are connected in parallel, a first end of the second capacitor is connected to the second end of the input matching circuit, a second end of the second capacitor is connected to first ends of the h resistors respectively, a second end of a first resistor is connected to the second end of the intermediate amplifier, and two ends of other h−1 resistors except the first resistor are respectively connected to one field effect transistor.

The feedback matching signal is transmitted to the first end of the second capacitor through the junction between the intermediate amplifier and the feedback circuit, and the control circuit transmits the intermediate amplification control signal to z field effect transistors in the feedback circuit. The z field effect transistors are turned on under the action of the intermediate amplification control signal, forming a negative feedback circuit including the z field effect transistors and z/2 resistors correspondingly connected, and the feedback matching signal is converted into the negative feedback signal through the negative feedback circuit.

In the above scheme, the intermediate amplification circuit further includes a t-stage intermediate amplification circuit, a (t−1)-stage intermediate matching circuit and t−1 inductors, and t is a positive integer greater than 1.

The second end of the input matching circuit is connected to a first end of a first stage intermediate amplification circuit, and a second end of the first stage intermediate amplification circuit is connected to a first end of a first stage intermediate matching circuit and a first end of a first inductor.

A first end of a k-th stage intermediate amplification circuit is connected to a second end of a (k−1)-th stage intermediate matching circuit, and a second end of the k-th stage intermediate amplification circuit is connected to a first end of a k-th stage intermediate matching circuit, and k is a positive integer greater than 1 and less than t.

A first end of a t-th stage intermediate amplification circuit is connected to a second end of a (t−1)-th stage intermediate matching circuit, and a second end of the t-th stage intermediate amplification circuit is connected to the first end of the output amplification circuit.

One end of the control circuit is connected to the third end of the input matching circuit, a third end of the t-stage intermediate amplification circuit, a third end of the (t−1)-stage intermediate matching circuit and second ends of the t−1 inductors.

The radio-frequency signal is converted into the first signal through the input matching circuit, the t-stage intermediate amplification circuit, the (t−1)-stage intermediate matching circuit and the t−1 inductors, and then transmitted to the output amplification circuit.

In the above scheme, the k-th stage intermediate matching circuit includes a third capacitor, a fourth capacitor, a first field effect transistor, a field effect transistors and 2a capacitors.

A first end of the third capacitor is connected to a first end of the fourth capacitor, and the first end of the third capacitor is connected to the second end of the k-th stage intermediate amplification circuit, and a second end of the third capacitor is connected to a first end of the first field effect transistor, and a second end of the first field effect transistor is grounded, and the a field effect transistors are connected in parallel and then connected to two ends of the fourth capacitor, and the 2a capacitors are respectively connected to two ends of the a field effect transistors, two ends of each field effect transistor are respectively connected to one capacitor, and a second end of a 2a-th capacitor is connected to a first end of a (k+1)-th stage intermediate amplification circuit.

A third end of the first field effect transistor and third ends of the a field effect transistors are connected to one end of the control circuit.

A k-stage signal is shunted at the junction of the third capacitor and the fourth capacitor to form a first oscillation signal and a second oscillation signal, and the first oscillation signal is transmitted to the first end of the third capacitor, and the control circuit transmits a k-th intermediate matching control signal to the third end of the first field effect transistor, and the first field effect transistor is turned on under an action of the k-th intermediate matching control signal, and the first oscillation signal is transmitted to a ground line.

The control circuit transmit the k-th intermediate matching control signal to b field effect transistors in the a field effect transistors.

The b field effect transistors are turned on under the action of the k-th intermediate matching control signal, and forms an amplification oscillation loop including b field effect transistors, 2b capacitors, the third capacitor and the fourth capacitor.

The k-stage signal forms oscillation through the amplification oscillation loop, and then a k-th matching signal is formed and transmitted to the (k+1)-th stage intermediate amplification circuit until a (t−1)-th matching signal is transmitted to the t-th stage intermediate amplification circuit.

In the above scheme, the output amplification circuit includes m output amplification sub-circuits; and first ends of the m output amplification sub-circuits are connected to the second end of the intermediate amplification circuit respectively.

The control circuit transmits the second control signal to an n-th output amplification sub-circuit in the m output amplification sub-circuits based on the behavior signal.

The n-th output amplification sub-circuit is turned on under the action of the second control signal and forms the output oscillation loop, and the first signal forms oscillation through the output oscillation loop, and then the emitting signal is formed and is transmitted to the emitting antenna.

In the above scheme, the n-th output amplification subcircuit includes a second field effect transistor, a first coil, a fifth capacitor and an n-th amplification circuit; and the second control signal includes m output control signals.

A first end of the second field effect transistor is connected to the second end of the intermediate amplification circuit, and a second end of the second field effect transistor is connected to a first end of the first coil, and a second end of the first coil is connected to a first end of the fifth capacitor, and a second end of the fifth capacitor is connected to a first end of the n-th amplification circuit, and the second end of the amplification circuit is connected to one end of the emitting antenna.

The control circuit is connected to a third end of the second field effect transistor and a third end of the n-th amplification circuit.

The control circuit transmits an n-th output control signal to the second field effect transistor, the second field effect transistor is turned on under an action of the n-th output control signal, and the first signal is transmitted to the n-th amplification circuit.

The n-th amplification circuit amplifies the first signal under the action of the n-th output control signal to form the emitting signal, and transmits the emitting signal to the emitting antenna.

An embodiment of the disclosure also provides a chip which integrates the reconfigurable high-integration radio-frequency amplifier as described above.

In an embodiment of the disclosure, when a signal source sends a radio-frequency signal to an input amplification circuit, a control circuit sends a first control signal to the input amplification circuit according to the frequency of the radio-frequency signal, and the input amplification circuit receives and response the first control signal and forms an input oscillation loop by several electronic devices of the plurality of electronic devices in the input amplification circuit, and the radio-frequency signal forms an amplified first signal through the input oscillation loop, and the input amplification circuit sends the first signal to an output amplification circuit. According to the frequency of the radio-frequency signal, the control circuit transmits a second control signal to the output amplification circuit. Under the action of the second control signal, the output amplification circuit forms an output oscillation loop matched with the first signal. The first signal is amplified by the output oscillation loop to form an emitting signal, the output oscillation loop transmits the emitting signal to the emitting antenna for emitting. Because when the input amplification circuit receives other frequencies of the radio-frequency signals, the input amplification circuit can also respond to the first control signal and form the input oscillation loop matched with other frequencies of the radio-frequency signals using several other electronic devices in the plurality of electronic devices, and the reconfigurable high-integration radio-frequency amplifier can form the oscillation loop corresponding to this frequency of the radio-frequency signal according to the frequency of the radio-frequency signal by the control circuit, and then amplify the radio-frequency signal. Therefore, the amplification of radio-frequency signal can be realized only by integrating one amplification circuit including a plurality of oscillation loops in a radio frequency front end chip, thereby reducing the area of the radio frequency front end chip and improving the packaging utilization rate of the radio frequency front end chip.

DETAILED DESCRIPTION

In order to make the purpose, technical scheme and advantages of this disclosure clearer, the technical scheme of this disclosure is described in detail in some embodiments below in combination with the drawings and embodiments. The described embodiments should not be regarded as limitations to embodiments of the disclosure. All other embodiments obtained by ordinary persons skilled in the art without creative work are within the scope of protection of this disclosure.

In the following description, it refers to "some embodiments", which describes a subset of all possible embodiments, but it can be understood that "some embodiments" can be the same subset or different subsets of all possible embodiments, and can be combined with each other without conflict.

If there is a similar description of "first/second" in an embodiment of the disclosure, the following explanation will be added. In the following descriptions, the term "first\second\third" is only used to distinguish similar objects, and does not represent a specific order for objects.

It can be understood that "first\second\third" can be interchanged in their specific order or sequence if allowed, so that embodiments of the disclosure described herein can be implemented in an order other than that illustrated or described herein.

Unless otherwise defined, all technical and scientific terms used herein have the same meanings as those commonly understood by those skilled in the technical field of embodiments of the disclosure. The terms used herein are only for the purpose of describing embodiments of the disclosure, and is not intended to limit the embodiment of this disclosure.

The trend of miniaturization of mobile terminal products puts forward higher requirements for the package size and integration of a radio-frequency front end chip. A related radio-frequency front end design scheme is generally composed of a multi-circuit power amplification chip, the power source control chip, the radio-frequency switch chip and the passive network. Because the multi-circuit power amplification chip, the power source control chip and the radio-frequency switch chip usually adopt different technologies and are connected to each other by the gold wire bonding, it is equivalent to making the multi-circuit amplification chip for different frequencies. In related technology, the multi-circuit power amplification chip, the power source control chip and the radio-frequency switch chip are attached to a substrate at the same time, and are connected by the gold wire bonding to form the radio-frequency front end chip. However, the corresponding amplifiers are set in the multi-circuit power amplification chip, so the area of the radio-frequency front end chip after connecting chips with different technologies is large, and it is difficult to package the radio-frequency front end chip under a fixed packaging size requirement.

Figure 1:
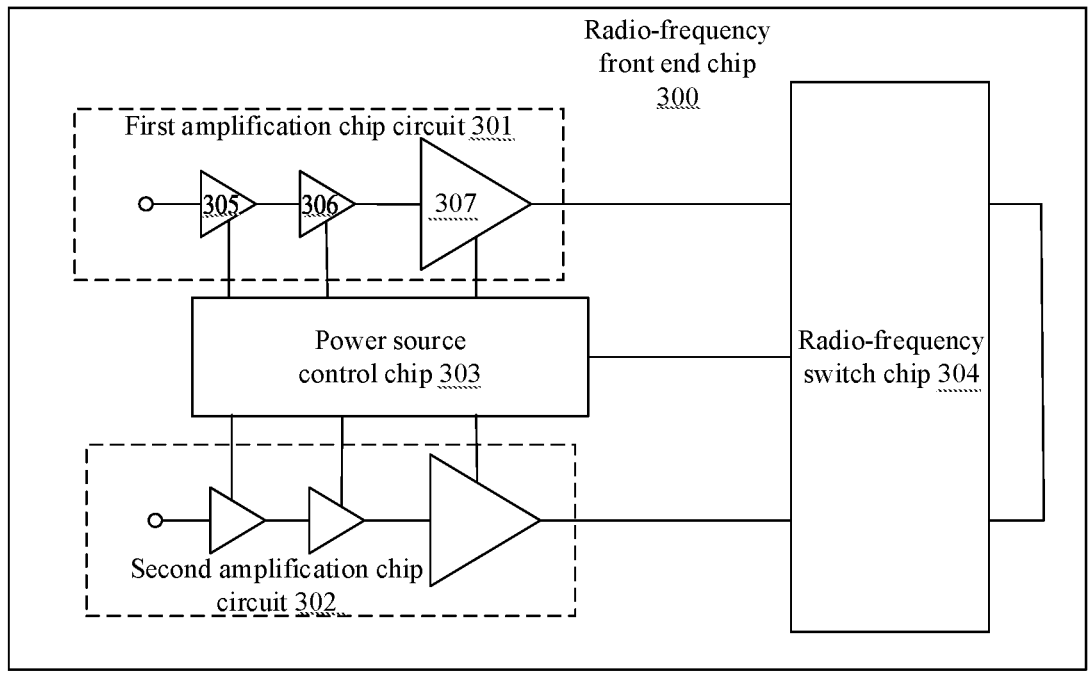
FIG. 1 is a schematic structural diagram of a radio-frequency front end chip in some implementations.

In some implementations, the design scheme of radio-frequency front end chip generally is composed of the multi-circuit power amplification chip, the power source control chip, the radio-frequency switch chip and the passive network. Because the corresponding amplifiers are set in the multi-circuit power amplification chip, the area of the radio-frequency front end chip after connecting chips with different processes is large. Moreover, the multi-circuit power amplification chip adopting gold wire bonding is complicated in structure, it is easy to occur abnormal connection. FIG. 1 is a schematic structural diagram of a radio-frequency front end chip 300 in some implementations, which includes a first amplification chip circuit 301, a second amplification chip circuit 302, a power source control chip 303 and an radio-frequency switch chip 304. Herein, the first amplification chip circuit 301 includes a first stage amplifier 305, a second stage amplifier 306 and a third stage amplifier 307. The second amplification chip circuit 302 has the same structure as the first amplification chip circuit 301, and also includes the multistage amplifier. Because of the large volume of each amplifier, the first amplification chip circuit 301 and the second amplification chip circuit 302 occupy a large area of the radio-frequency front end chip 300.

Figure 2:
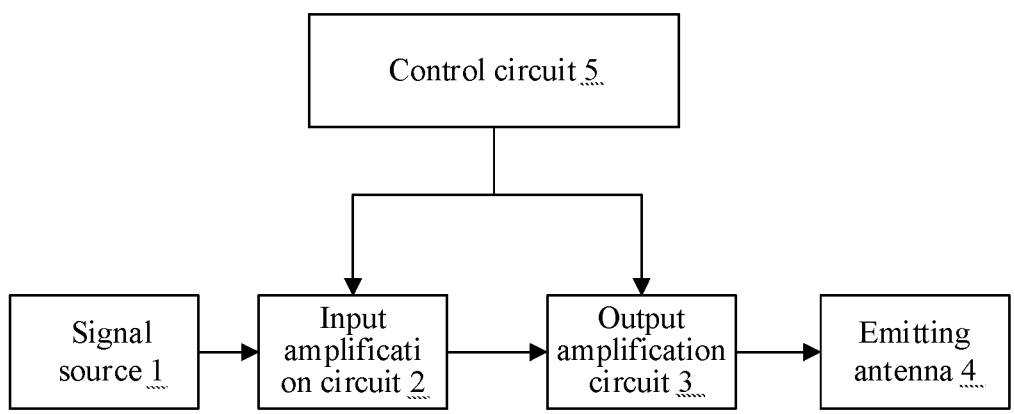
FIG. 2 is a structural diagram 1 of a reconfigurable high-integration radio-frequency amplifier provided by an embodiment of this disclosure.

In order to solve the technical problem of large area of radio-frequency front end chip 300, an embodiment of the disclosure provides a reconfigurable high-integration radio-frequency amplifier. Please refer to FIG. 2, which is the structural diagram 1 of the reconfigurable high-integration radio-frequency amplifier provided by an embodiment of the disclosure.

An embodiment of the disclosure provides a reconfigurable high-integration radio-frequency amplifier, which includes a signal source 1, a control circuit 5, an input amplification circuit 2, an output amplification circuit 3 and an emitting antenna 4. The first end of the input amplification circuit 2 is connected with the signal source 1, and the second end of the input amplification circuit 2 is connected with the first end of the output amplification circuit 3. The second end of the output amplification circuit 3 is connected with the emitting antenna 4, and one end of the control circuit 5 is connected to a third end of the input amplification circuit 2 and a third end of the output amplification circuit 3.

When the signal source 1 transmits a radio-frequency signal to the input amplification circuit 2, the control circuit 5 transmits a first control signal to the input amplification circuit 2 according to the frequency of the radio-frequency signal. Under the action of the first control signal, the input amplification circuit 2 forms an input oscillation loop matching with the radio-frequency signal. The radio-frequency signal forms an amplified first signal via the input oscillation loop, and the input amplification circuit 2 transmits the first signal to the output amplification circuit 3.

The control circuit 5 transmits a second control signal to the output amplification circuit 3 according to the frequency of the radio-frequency signal. Under the action of the second control signal, the output amplification circuit 3 forms an output oscillation loop matched with the first signal. The first signal is amplified by the output oscillation loop to form an emitting signal, and the emitting signal is transmitted through the emitting antenna 4.

In an embodiment of the disclosure, the control circuit 5 may include a multi control unit (MCU). The control circuit 5 forms the first control signal and the second control signal according to the frequency of the radio-frequency signal through preset logic. When the signal source 1 transmits the radio-frequency signal to the input amplification circuit 2, the control circuit 5 transmits the first control signal to the third end of the input amplification circuit 2, and the control circuit 5 transmits the second control signal to the third end of the output amplification circuit 3. The control circuit 5 may also be other logic processors or logic circuits with the same functions.

In an embodiment of the disclosure, the signal source 1 may be a radio frequency integrated signal generator. Signal source 1 can emit radio-frequency signals with a frequency of 10 MHz~50 GHz. An intermediate amplification circuit and a plurality of electronic devices are provided in the input amplification circuit 2. When the signal source 1 transmits the radio-frequency signal to the input amplification circuit 2, the control circuit 5 forms the first control signal according to the frequency of the radio-frequency signal. The control circuit 5 transmits the first control signal to the third end of the input amplification circuit 2. Under the action of the first control signal, the input amplification circuit 2 forms the input oscillation loop matched with the frequency of the radio-frequency signal by using n electronic devices of the plurality of electronic devices. The oscillation loop forms oscillations under the action of the radio-frequency signal, and then the first signal is formed by the amplification of the intermediate amplification circuit. The signal amplifier transmits the first signal to the output amplification circuit 3.

Figure 3:
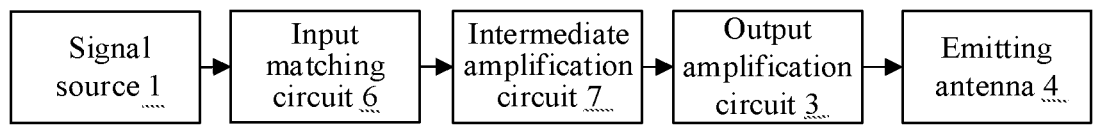
FIG. 3 is a structural diagram 2 of a reconfigurable high-integration radio-frequency amplifier provided by an embodiment of this disclosure.

Referring to FIG. 3, in an embodiment of this disclosure, the input amplification circuit 2 may include an input matching circuit 6 and a multistage intermediate amplification circuit 7. When the signal source 1 transmits the radio-frequency signal to the input amplification circuit 2, the control circuit 5 forms the first control signal according to the frequency of the radio-frequency signal. The control circuit 5 transmits the first control signal to the third end of the input matching circuit 6. Under the action of the first control signal, the input matching circuit 6 forms the input oscillation loop that matches the frequency of the radio-frequency signal. The input oscillation loop forms the oscillation under the action of the radio-frequency signal, and then the first signal is formed by step-by-step amplification of the multi-stage intermediate amplification circuit 7 until the last stage intermediate amplification circuit 7. The last intermediate amplification circuit 7 transmits the first signal to the output amplification circuit 3.

The control circuit 5 forms the second control signal according to the frequency of the radio-frequency signal. The control circuit 5 transmits the second control signal to the third end of the output amplification circuit 3. Under the action of the second control signal, the output amplification circuit 3 forms an output oscillation loop matched with the first signal. The output oscillation loop forms oscillation under the action of the first signal, and then it is amplified by the signal amplifier to form the emitting signal. The output amplification circuit 3 transmits the emitting signal to the emitting antenna 4, and the emitting antenna 4 converts the energy of the emitting signal into electromagnetic waves and transmits them.

It should be noted that, in an embodiment of the disclosure, the control circuit 5 is connected to the third end of the input amplification circuit 2 and the third end of the output amplification circuit 3. To simplify the drawings, the control circuit 5 is not shown in the drawings of the following embodiments.

In an embodiment of the disclosure, when a signal source sends a radio-frequency signal to an input amplification circuit, a control circuit sends a first control signal to the input amplification circuit according to the frequency of the radio-frequency signal, and the input amplification circuit receives a first control signal, and forms an input oscillation loop. The radio-frequency signal forms an amplified first signal through the input oscillation loop, and the input amplification circuit sends the first signal to an output amplification circuit. The input amplification circuit includes: a plurality of input oscillation loops respectively matched with multiple frequencies of the radio-frequency signals. The control circuit transmits a second control signal to the output amplification circuit according to the frequency of the radio-frequency signal, and the output amplification circuit forms an output oscillation loop matched with the first signal under the action of the second control signal, and the first signal forms an emitting signal after amplified by the output oscillation loop, and the output amplification circuit transmits the emitting signal to the emitting antenna for transmission. The output amplification circuit includes a plurality of output oscillation loops respectively matched with multiple frequencies of radio-frequency signals. Because the oscillation loops matched with different frequencies of the radio-frequency signals are integrated in the input amplification circuit and the output amplification circuit, and the formation of the oscillation loops corresponding to the frequency of the radio-frequency signal is controlled by the control circuit according to the frequency of the radio-frequency signal, thereby amplifying the radio-frequency signal, the amplification of a radio-frequency signal can be realized only by integrating one amplification circuit including the plurality of oscillation loops in the circuit of a radio frequency front end, thereby reducing the area of a radio frequency front end chip and improving the packaging utilization rate of the radio frequency front end chip.

An embodiment of the disclosure provides a reconfigurable high-integration radio-frequency amplifier. Please refer to FIG. 3, which is the second structural diagram 2 of the reconfigurable high-integration radio-frequency amplifier provided by the embodiment of the disclosure. In the embodiment of the disclosure, the input amplification circuit 2 includes the input matching circuit 6 and the intermediate amplification circuit 7. The first control signal includes an input control signal and an intermediate amplification control signal. A first end of the input matching circuit 6 is connected to the signal source 1, a second end of the input matching circuit 6 is connected to a first end of the intermediate amplification circuit 7, and a second end of the intermediate amplification circuit 7 is connected to the first end of the output amplification circuit 3. The second end of the output amplification circuit 3 is connected to the emitting antenna 4. One end of the control circuit 5 is connected to the third end of the input matching circuit 6 and a third end of the intermediate amplification circuit 7.

When the signal source 1 transmits the radio-frequency signal to the input matching circuit 6, the control circuit 5 acquires the behavior signal of the target object of the reconfigurable high-integration radio-frequency amplifier. The control circuit 5 transmits the input control signal to the input matching circuit 6 based on the behavior signal. Under the action of the input control signal, the input matching circuit 6 forms the input oscillation loop that matches the radio-frequency signal.

The radio-frequency signal forms oscillation through the input oscillation loop, and further forms a first matching signal and send it to the intermediate amplification circuit 7.

The control circuit 5 sends the intermediate amplification control signal to the intermediate amplification circuit 7 based on the behavior signal. Under the action of the intermediate amplification control signal, the intermediate amplification circuit 7 amplifies the first matching signal to form the first signal, and transmits the first signal to the output amplification circuit 3.

Furthermore, the output amplification circuit 3 receives the first signal. Under the action of the second control signal, the output amplification circuit 3 forms the output oscillation loop matching the first signal. The first signal forms oscillation through the output oscillation loop, and then is amplified by the output amplification circuit 3 to form the emitting signal.

In an embodiment of the disclosure, when the signal source 1 transmits the radio-frequency signal to the input matching circuit 6, the target object of reconfigurable high-integration radio-frequency amplifier, i.e., the operator presses the button of the control circuit 5 corresponding to the frequency of the radio-frequency signal. The control circuit 5 acquires the behavior signal of the target object transmitted from the button. The control circuit 5 forms the input control signal, the intermediate amplification control signal and the second control signal according to a preset program in response to the behavior signal. The control circuit 5 transmits the input control signal to the third end of the input matching circuit 6. The control circuit 5 transmits the intermediate amplification control signal to the third end of the intermediate amplification circuit 7. The control circuit 5 transmits the second control signal to the third end of the output amplification circuit 3.

Figure 5:
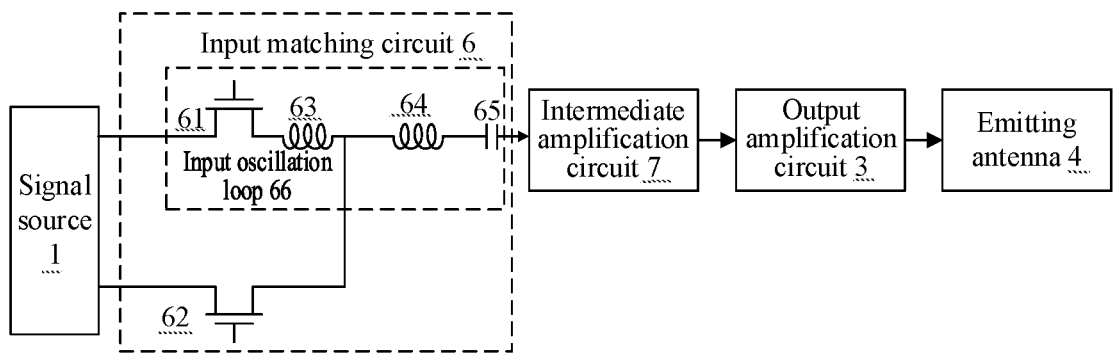
FIG. 5 is a structural diagram 4 of a reconfigurable high-integration radio-frequency amplifier provided by an embodiment of this disclosure.

In an embodiment of the disclosure, combined with FIG. 5, the input oscillation loop 66 forms oscillation under the action of the radio-frequency signal, and then the first matching signal is formed. In the input oscillation loop 66, only the mutual transformation between the magnetic field energy of inductor coils and the electric field energy of capacitors occurs under the action of the radio-frequency signal, thereby forming the first matching signal.

Figure 4:
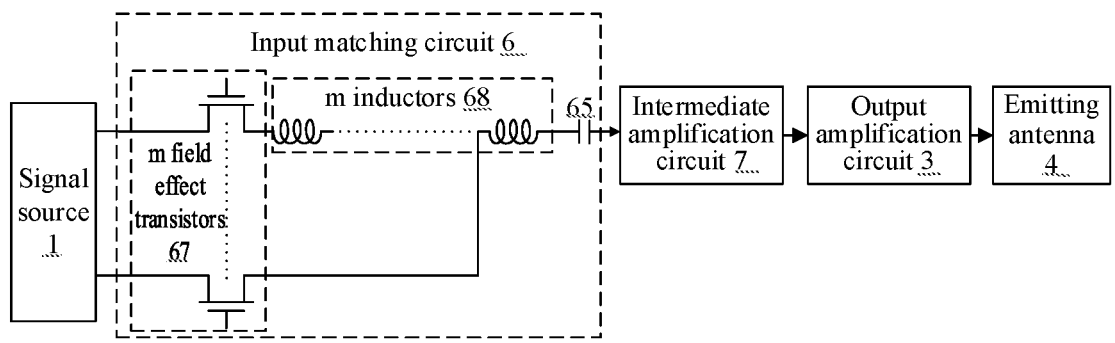
FIG. 4 is a structural diagram 3 of a reconfigurable high-integration radio-frequency amplifier provided by an embodiment of this disclosure.

Please refer to FIG. 4, which is the structural diagram 3 of the reconfigurable high-integration radio-frequency amplifier provided by an embodiment of this disclosure.

In an embodiment of the disclosure, the input matching circuit 6 includes m field effect transistors 67, m inductors 68 and a first capacitor 65, and m is a positive integer greater than 1. Herein, m inductors 68 are successively connected in series. The first ends of the m field effect transistors 67 are connected to the signal source 1 respectively, and the second end of the m field effect transistors is connected to the first end of the m inductors. The second end of the i-th inductor is connected to the second end of the (i+1)-th field effect transistor, and the second end of the m-th inductor is connected to the first end of the first capacitor 65, and the second end of the first capacitor 65 is connected to the first end of the intermediate amplification circuit 7. Herein, i is a positive integer greater than or equal to 1 and less than m. The third ends of the m field effect transistors 67 are connected to one end of the control circuit 5 respectively.

When the signal source 1 transmits the radio-frequency signal to the input matching circuit 6, the control circuit 5 transmits the input control signal to the n-th field effect transistor. The n-th field effect transistor is turned on under the action of the input control signal, and the input oscillation loop 66 including the n-th field effect transistor, m−n+1 inductors and the first capacitor is formed. The radio-frequency signal flows through the input oscillation loop 66 to form the first matching signal which is sent to the intermediate amplification circuit 7. Herein, n is a positive integer greater than or equal to 1 and less than or equal to m.

In an embodiment of the disclosure, the input matching circuit 6 may include a No. 1 field effect transistor 61, a No. 2 field effect transistor 62, a first inductor 63, a second inductor 64 and a first capacitor 65. Please refer to FIG. 5, which is the structural diagram 4 of the reconfigurable high-integration radio-frequency amplifier provided by an embodiment of the disclosure.

In an embodiment of the disclosure, the first inductor 63 and the second inductor 64 are successively connected in series. A first end of the No. 1 field effect transistor 61 is connected to the signal source 1, and a first end of the No. 2 field effect transistor 62 is connected to the signal source 1. A second end of the No. 1 field effect transistor 61 is connected to a first end of the first inductor 63. A second end of the No. 2 field effect transistor 62 is connected to a first end of the second inductor 64. A second end of the second inductor 64 is connected to a first end of the first capacitor 65, and a second end of the first capacitor 65 is connected to the first end of the intermediate amplification circuit 7. A third end of the No. 1 field effect transistor 61 and a third end of the No. 2 field effect transistor 62 are connected to one end of the control circuit 5.

In an embodiment of the disclosure, when the signal source 1 transmits the radio-frequency signal to the input matching circuit 6, the target object of the reconfigurable high-integration radio-frequency amplifier presses the button of the control circuit 5 corresponding to the frequency of the radio-frequency signal. The control circuit 5 acquires the behavior signal of the target object. The control circuit 5 forms the input control signal according to a preset program in response to the behavior signal. The control circuit 5 transmits the input control signal to the third end of the No. 1 field effect transistor 61 or the No. 2 field effect transistor 62. The No. 1 field effect transistor 61 or the No. 2 field effect transistor 62 is turned on. When the No. 1 field effect transistor 61 is turned on, the input matching circuit 6 forms the input oscillation loop 66 including the No. 1 field effect transistor 61, the first inductor 63, the second inductor 64 and the first capacitor 65.

In an embodiment of the disclosure, the No. 1 field effect transistor 61 may be a junction field effect transistor and a metal-oxide semiconductor field effect transistor (MOS-FET for short), i.e., MOS field effect transistor. When the field effect transistor is the MOS field effect transistor, since the MOS field effect transistor has a minimum turn-on voltage, the MOS field effect transistor is turned on as the control circuit transmits the input matching signal to a third end of the MOS field effect transistor, i.e. the gate of the MOS field effect transistor, and the voltage of the input matching signal is greater than the minimum turn-on voltage. Then the input matching circuit 6 forms the input oscillation loop 66.

An embodiment of the disclosure provides the reconfigurable high-integration radio-frequency amplifier. Please refer to FIG. 6, which is the structural diagram 5 of the reconfigurable high-integration radio-frequency amplifier provided by an embodiment of this disclosure.

An intermediate amplification circuit 7 provided by an embodiment of the disclosure includes an intermediate amplifier 72 and a feedback circuit 71. A first end of the intermediate amplifier 72 is grounded, and a third end of the intermediate amplifier 72 is connected with a first end of the feedback circuit 71 and then is connected with the second end of the input matching circuit 6. A second end of the feedback circuit 71 is connected with a second end of the intermediate amplifier 72, which is connected with the first end of the output amplification circuit 3. A third end of the feedback circuit 71 is connected with one end of the control circuit 5.

The first matching signal is shunted at the junction of the intermediate amplifier 72 and the feedback circuit 71, forming an amplification matching signal and a feedback matching signal. The amplification matching signal is transmitted to the third end of the intermediate amplifier 72 by the input matching circuit 6 to be amplified to form said first signal, which is transmitted to the output amplification circuit 3. The input matching circuit 6 transmits the feedback matching signal to the first end of the feedback circuit 71.

The amplification matching signal is amplified by the intermediate amplifier 72 to form the first signal, and the intermediate amplifier 72 transmits the first signal to the output amplification circuit 3.

The control circuit 5 transmits the intermediate amplification control signal to the third end of the feedback circuit 71, the feedback circuit 71 converts the feedback matching signal into a negative feedback signal under the action of the intermediate amplification control signal, and the negative feedback signal and the first matching signal are matched and cancelled. Because the first signal is formed by amplifying shunted the first matching signal, after the negative feedback signal and the first matching signal are matched to cancel the gain, the stability of the first signal is maintained.

In an embodiment of the disclosure, the feedback circuit 71 includes a second capacitor, h resistors and 2(h−1) field effect transistors, and h is a positive integer greater than 1.

Herein, h resistors are connected in parallel. A first end of the second capacitor is connected with the second end of the input matching circuit 6, and the first ends of h resistors are connected with a second end of the second capacitor respectively. A second end of the first resistor is connected with the second end of the intermediate amplifier 72, and two ends of other h−1 resistors except the first resistor are respectively connected with one field effect transistor.

The feedback matching signal is transmitted to the first end of the second capacitor through the junction between the intermediate amplifier 72 and the feedback circuit 71. The control circuit 5 transmits the intermediate amplification control signals to z field effect transistors in the feedback circuit 71. Herein, z field effect transistors are turned on under the action of the intermediate amplification control signal, forming a negative feedback circuit including z field effect transistors and z/2 resistors connected correspondingly. The feedback matching signal is converted into the negative feedback signal by the negative feedback circuit.

Figure 7:
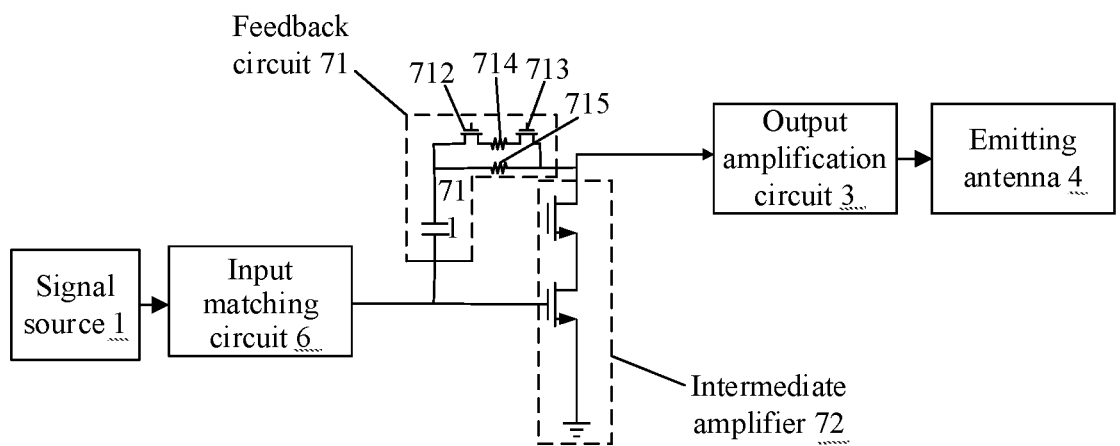
FIG. 7 is a structural diagram 6 of a reconfigurable high-integration radio-frequency amplifier provided by an embodiment of this disclosure.

In an embodiment of the disclosure, the feedback circuit 71 includes a second capacitor 711, a first resistor 714, a second resistor 715, a No. 3 field effect transistor 712 and a No. 4 field effect transistor 713. Please refer to FIG. 7, which is the structural diagram 6 of the reconfigurable high-integration radio-frequency amplifier provided by an embodiment of this disclosure.

The first resistor 714 and the second resistor 715 are connected in parallel. A first end of the second capacitor 711 is connected to the second end of the input matching circuit 6, and a first end of the first resistor 714 and a second end of the second resistor 715 are both connected to a second end of the second capacitor 711. A second end of the first resistor 714 is connected to the second end of the intermediate amplifier 72. Two ends of the second resistor 715 are respectively connected to the No. 3 field effect transistor and the No. 4 field effect transistor.

The first end of the second capacitor 711 obtains the feedback matching signal from the junction of the intermediate amplifier 72 and the feedback circuit 71. The control circuit 5 transmits intermediate amplification control signals to the No. 3 field effect transistor 712 and the No. 4 field effect transistor 713. The No. 3 field effect transistor 712 and No. 4 field effect transistor 713 are turned on under the action of the intermediate amplification control signal, the negative feedback circuit including the No. 3 field effect transistor 712, the No. 4 field effect transistor 713, the first resistor 714 and the second resistor 715 is formed. The feedback matching signal is converted into the negative feedback signal by the negative feedback circuit.

Figure 8:
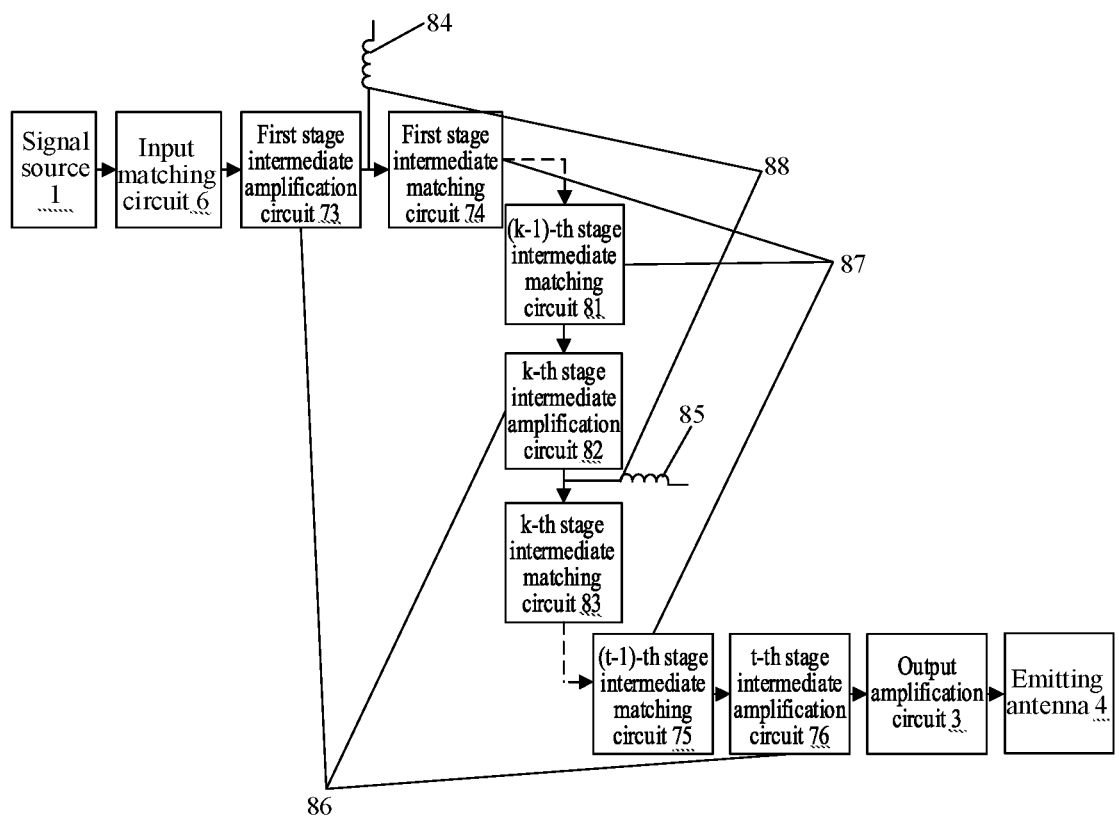
FIG. 8 is a structural diagram 7 of a reconfigurable high-integration radio-frequency amplifier provided by an embodiment of this disclosure.

The embodiment of the disclosure provides the reconfigurable high-integration radio-frequency amplifier with high integration. Please refer to FIG. 8, which is the structural diagram 7 of the reconfigurable high-integration radio-frequency amplifier provided by an embodiment of this disclosure.

In an embodiment of the disclosure, the intermediate amplification circuit 7 further includes: t-stage intermediate amplification circuit 86, (t−1)-stage intermediate matching circuit 87 and t−1 inductors 88, herein, t is a positive integer greater than 1. A second end of the input matching circuit 6 is connected to a first end of the first stage intermediate amplification circuit 73, and a second end of the first stage intermediate amplification circuit 73 is connected to a first end of the first stage intermediate matching circuit 74 and a first end of the first inductor 84.

A first end of a k-th stage intermediate amplification circuit 82 is connected to a second end of a (k−1)-th stage intermediate matching circuit 81, and a second end of said k-th stage intermediate amplification circuit 82 is connected to a first end of a k-th stage intermediate matching circuit 83 and a first end of a k-th inductor 85, herein, k is a positive integer greater than 1 and less than t.

A first end of a t-th stage intermediate amplification circuit 76 is connected to a second end of a (t−1)-th stage intermediate matching circuit 75, and a second end of the t-th stage intermediate amplification circuit 76 is connected to the first end of the output amplification circuit 3.

One end of the control circuit 5 is connected to the third end of the input matching circuit 6, a third end of the t-stage intermediate amplification circuit 86, a third end of the (t−1)-stage intermediate matching circuit 87 and a second end of the t−1 inductors 88. In an embodiment of the disclosure, in order to simplify the drawing, the control circuit 5 is not shown. The dotted line in the drawing indicates an omitted intermediate amplification circuit and an omitted intermediate matching circuit.

The radio-frequency signal is converted into the first signal by the input matching circuit 6, the t-stage intermediate amplification circuit 86, the (t−1)-stage intermediate matching circuit 87 and the t−1 inductors 88, and the first signal is transmitted to the output amplification circuit 3.

In an embodiment of the disclosure, the input matching circuit 6 forms the input oscillation loop 66 under the action of the input control signal. The radio-frequency signal flows through the input oscillation loop 66, and the input oscillation loop 66 forms oscillation under the action of the radio-frequency signal, thereby forming the first matching signal. The input oscillation loop 66 transmits the first matching signal to the first stage intermediate amplification circuit 73.

The k-th stage intermediate amplification circuit 82 obtains a (k−1)-th matching signal from the k-lth stage intermediate matching control circuit 81, and amplifies the (k−1)-th matching signal to form a k-th stage signal under the action of the k-th intermediate amplification control signal. The k-th stage intermediate amplification circuit 82 transmits the k-th stage signal to the k-th stage intermediate matching circuit 83. The t-th stage intermediate amplification circuit 76 receives the (t−1)-th matching signal and amplifies the (t−1)-th matching signal to form the first signal under the action of a t-th intermediate amplification control signal. The t-th stage intermediate amplification circuit 76 transmits the first signal to the output amplification circuit 3.

Figure 9:
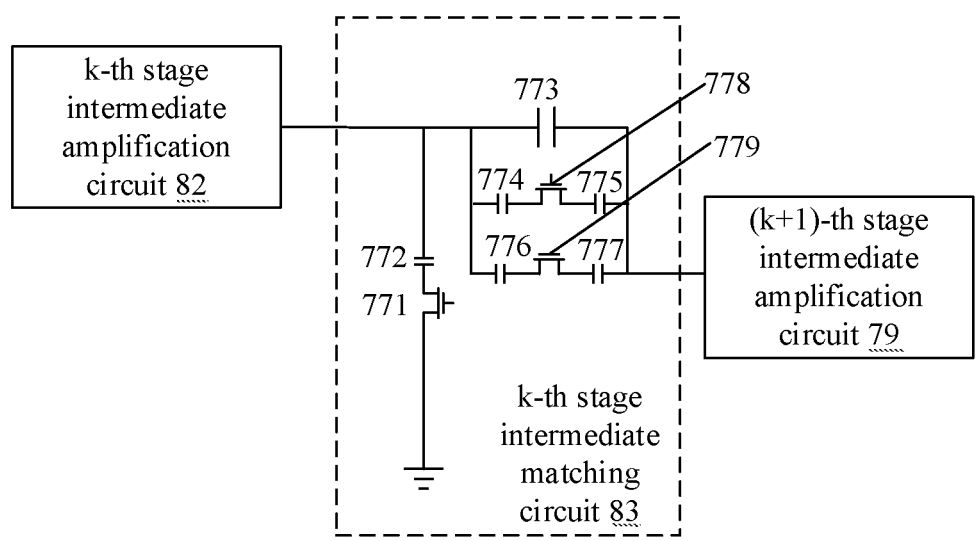
FIG. 9 is a structural diagram 8 of a reconfigurable high-integration radio-frequency amplifier provided by an embodiment of this disclosure.

Referring to FIG. 9, in an embodiment of the disclosure, the k-th stage intermediate matching circuit 83 includes a third capacitor 772, a fourth capacitor 773, a first field effect transistor 771, a field effect transistors and 2a capacitors.

A first end of the third capacitor 772 is connected to a first end of the fourth capacitor 773, and the first end of the third capacitor 772 is connected to the second end of the k-th stage intermediate amplification circuit 82. A second end of the third capacitor 772 is connected to a first end of the first field effect transistor 771, and a second end of the first field effect transistor 771 is grounded. Herein, a field effect transistors are connected in parallel and then connected to two ends of the fourth capacitor 773, 2a capacitors are respectively connected to two ends of the a field effect transistors, and two ends of each field effect transistor are connected to one capacitor respectively. A second end of the 2a-th capacitor is connected to a first end of the (k+1)-th stage intermediate amplification circuit 79. A third end of the first field effect transistor 771 and third ends of the a field effect transistors are connected to one end of the control circuit 5.

The k-stage signal is shunted at the junction of the third capacitor 772 and the fourth capacitor 773 to form a first oscillation signal and a second oscillation signal. The first oscillation signal is transmitted to the first end of the third capacitor 772. The control circuit 5 transmits the k-th intermediate matching control signal to the third end of the first field effect transistor 771. The first field effect transistor 771 is turned on under the action of the intermediate matching control signal, and the first oscillation signal is transmitted to a ground line.

The control circuit 5 transmit the k-th intermediate matching control signal to b field effect transistors of the a field effect transistors. The b field effect transistors are turned on under the action of the k-th intermediate matching control signal, forming an amplification oscillation loop including the b field effect transistors, 2b capacitors, the third capacitor 772 and the fourth capacitor 773.

The k-stage signal forms oscillation through the amplification oscillation loop, and then forms a k-th matching signal, which is sent to the (k+1)-th stage intermediate amplification circuit 79, until the (t−1)-th matching signal is transmitted to the t-th stage intermediate amplification circuit 76.

In an embodiment of the disclosure, the k-th stage intermediate matching 83 circuit includes the third capacitor 772, the fourth capacitor 773, a No. 1 capacitor 774, a No. 2 capacitor 775, a No. 3 capacitor 776, a No. 4 capacitor 777, the first field effect transistor 771, a No. 5 field effect transistor 778 and a No. 6 field effect transistor 779. Please refer to FIG. 9, which is the structural diagram 8 of the reconfigurable high-integration radio-frequency amplifier provided by an embodiment of this disclosure.

The first end of the third capacitor 772 is connected to the first end of the fourth capacitor 773, and the first end of the third capacitor 772 is connected to the second end of the k-th stage intermediate amplification circuit 82. The second end of the third capacitor 772 is connected to the first end of the first field effect transistor 771, and the second end of the first field effect transistor 771 is grounded. The No. 5 field effect transistor 778 and No. 6 field effect transistor 779 are connected in parallel and then connected to the two ends of the fourth capacitor 773. The No. 1 capacitor 774 and No. 2 capacitor 775 are connected to two ends of the No. 5 field effect transistor 778 respectively. The No. 3 capacitor 776 and No. 4 capacitor 777 are connected to two ends of the No. 6 field effect transistor 779 respectively. A second end of the No. 4 capacitor 777 is connected to the first end of the (k+1)-th stage intermediate amplification circuit 79.

The third end of the first field effect transistor 771, third ends of the No. 5 field effect transistor 778 and No. 6 field effect transistor 779 are connected to one end of the control circuit 5.

The k-stage signal is shunted at the junction of the third capacitor 773 and the fourth capacitor 773, forming the first oscillation signal and the second oscillation signal. The first oscillation signal is sent to the first end of the third capacitor 772. The control circuit 5 transmits the k-th intermediate matching control signal to the third end of the first field effect transistor 771. The first field effect transistor 771 is turned on under the action of the intermediate matching control signal, and the first oscillation signal is transmitted to the ground line. The control circuit 5 transmits the k-th intermediate matching control signal to the No. 5 field effect transistor 778. The No. 5 field effect transistor is turned on under the action of the k-th intermediate matching control signal, forming the amplification oscillation loop including the No. 5 field effect transistor, the No. 1 capacitor 774, the No. 2 capacitor 775, the No. 3 capacitor 772 and the fourth capacitor 773.

The k-stage signal flows through the amplification oscillation loop, the amplification oscillation loop forms oscillation under the action of the k-th stage signal, thereby forming the k-th matching signal, and the amplification oscillation loop transmits the k-th matching signal to the k+1-th stage intermediate amplification circuit 79.

The embodiment of the disclosure provides the reconfigurable high-integration radio-frequency amplifier. Referring with FIG. 10 and FIG. 11, the output amplification circuit 3 in the embodiment of this disclosure includes m output amplification sub-circuits 33.

A first end of the m output amplification sub-circuits 33 is connected with the second end of the intermediate amplification circuit 7. Based on the behavior signal, the control circuit 5 transmits the second control signal to an n-th output amplification sub-circuit 30 in the m output amplification sub-circuits 33. The n-th output amplification sub-circuit 30 is turned on under the action of the second control signal, forming the output oscillation loop, and the first signal forms oscillation through the output oscillation loop, thereby forming the emitting signal, and transmitting to the emitting antenna 4.

Figure 10:
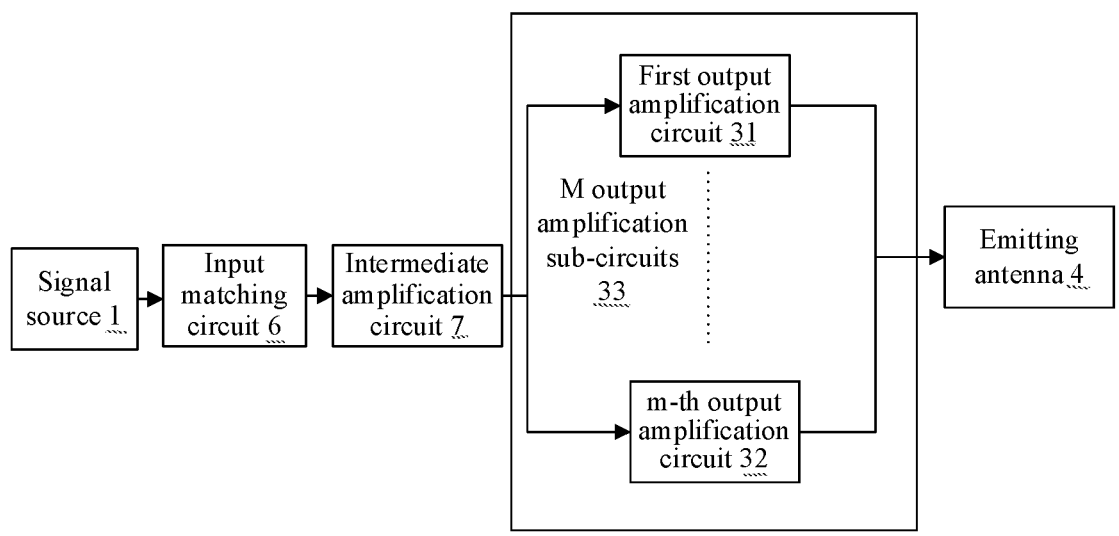
FIG. 10 is a structural diagram 9 of a reconfigurable high-integration radio-frequency amplifier provided by an embodiment of this disclosure.

Please refer to FIG. 10, which is the structural diagram 9 of the reconfigurable high-integration radio-frequency amplifier provided by an embodiment of this disclosure.

In the embodiment of the disclosure, the output amplification circuit 3 includes a first output amplification circuit 31 to an m-th output amplification circuit 32. First ends of the first output amplification circuit 31 to the m-th output amplification circuit 32 are connected to the second end of the intermediate amplification circuit 7. Second ends of the first output amplification circuit 31 to the m-th output amplification circuit 32 are connected to the emitting antenna 4.

Figure 11:
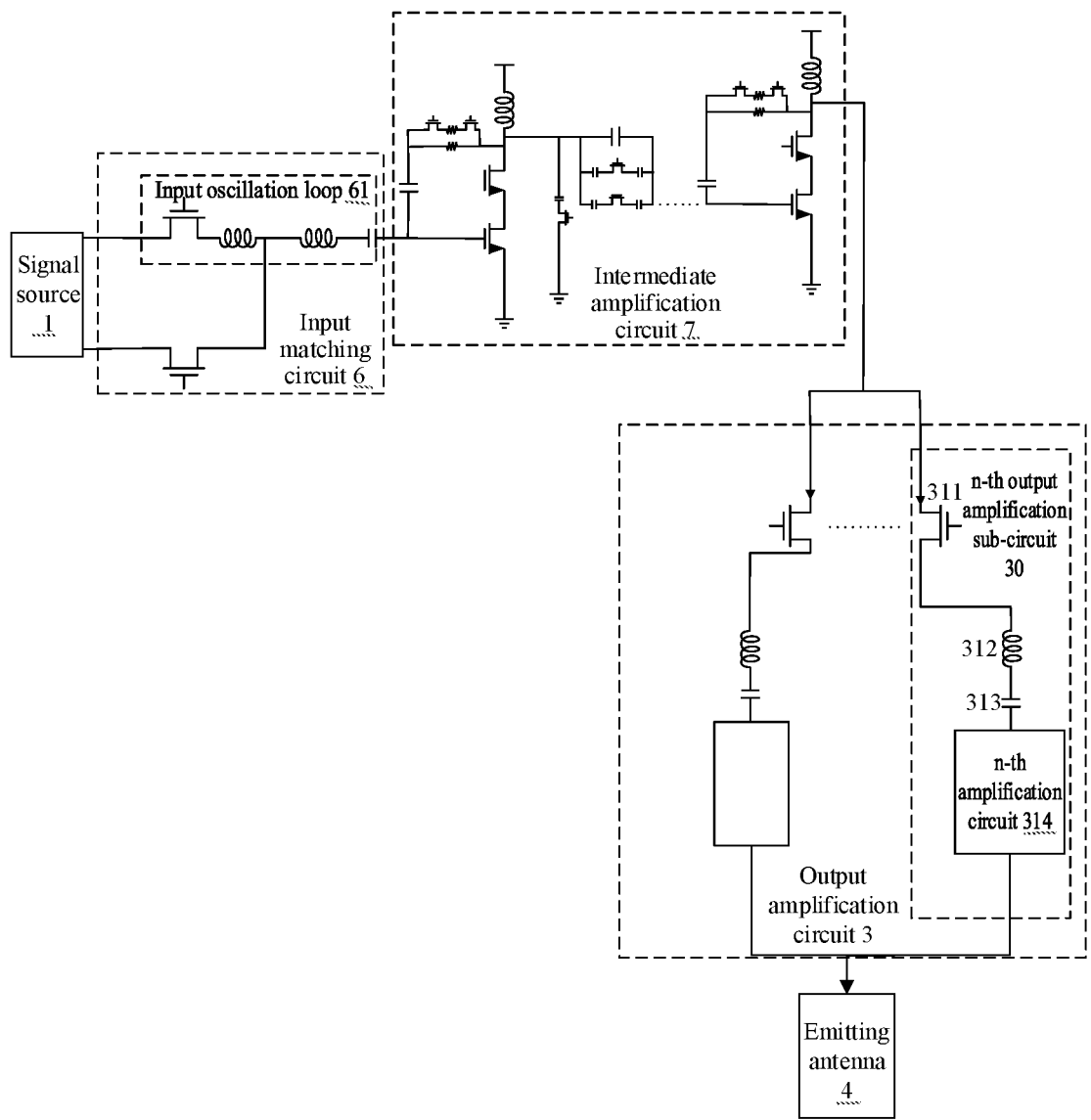
FIG. 11 is a structural diagram 10 of a reconfigurable high-integration radio-frequency amplifier provided by an embodiment of this disclosure.

Please refer to FIG. 11, which is the structural diagram 10 of the reconfigurable high-integration radio-frequency amplifier provided by an embodiment of this disclosure.

In the embodiment of the disclosure, the n-th output amplification sub-circuit 30 includes a second field effect transistor 311, a first coil 312, a fifth capacitor 313 and an n-th amplification circuit 314. The second control signal includes m output control signals.

A first end of the second field effect transistor 311 is connected to the second end of the intermediate amplification circuit 7, and a second end of the second field effect transistor 311 is connected to a first end of the first coil 312. A second end of the first coil 312 is connected to a first end of the fifth capacitor 313, a second end of the fifth capacitor 313 is connected to a first end of the n-th amplification circuit 314, and a second end of the n-th amplification circuit 314 is connected to one end of the emitting antenna 4. One end of the control circuit 5 is connected to a third end of the second field effect transistor 311 and a third end of the n-th amplification circuit 314.

The control circuit 5 transmits an n-th output control signal to the second field effect transistor 311, which is turned on under the action of the n-th output control signal, and the first signal is transmitted to the n-th amplification circuit 314. The n-th amplification circuit 314 amplifies the first signal under the action of the n-th output control signal to form the emitting signal and transmits it to the emitting antenna 4.

Figure 6:
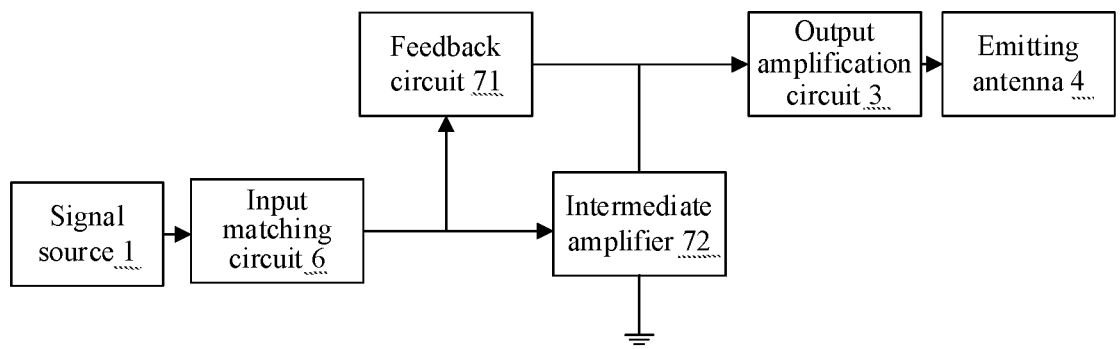
FIG. 6 is a structural diagram 5 of a reconfigurable high-integration radio-frequency amplifier provided by an embodiment of this disclosure.

The structure of the n-th amplification circuit 314 in the embodiment of the disclosure is the same as that of the intermediate amplification circuit 7 in FIG. 6, so they will not be repeated here.

Please refer to FIG. 11, which is the structural diagram 10 of the reconfigurable high-integration radio-frequency amplifier provided by an embodiment of this disclosure.

In the embodiment of the disclosure, when the signal source 1 transmits the radio-frequency signal to the input matching circuit 6, the control circuit 5 acquires the behavior signal of the target object of the reconfigurable high-integration radio-frequency amplifier. The control circuit 5 transmits the input control signal to the input matching circuit 6 based on the behavior signal. Under the action of the input control signal, the input matching circuit 6 forms the input oscillation loop 66 that matches the radio-frequency signal. The radio-frequency signal flows through the input oscillation loop 66, the input oscillation loop 66 forms oscillation under the action of the radio-frequency signal, and thus the first matching signal is formed. The input oscillation loop 66 transmits the first matching signal to the intermediate amplification circuit 7.

Based on the behavior signal, the control circuit 5 sends the intermediate amplification control signal to multi-stage amplification circuits in the intermediate amplification circuit 7 respectively. The multi-stage amplification circuit amplifies the first matching signal step by step to form the first signal under the action of the intermediate amplification control signal, and the intermediate amplification circuit 7 transmits the first signal to the output amplification circuit 3.

Based on the behavior signal, the control circuit 5 transmits the second control signal to the n-th output amplification sub-circuit 30 in the output amplification circuit 3. The n-th output amplification sub-circuit 30 is turned on under the action of the second control signal to form the output oscillation loop. The first signal flows through the output oscillation loop, the output oscillation loop forms oscillation under the action of the first signal, and then is amplified by the n-th amplification circuit 314 in the n-th output amplification sub-circuit 30 to form the emitting signal. The n-th amplification circuit 314 transmits the emitting signal to the emitting antenna for emitting.

In the embodiment of the disclosure, the oscillation loops matched with different frequencies of the radio-frequency signals are integrated in the input amplification circuit and the output amplification circuit, the formation of the oscillation loops corresponding to the frequency of the radio-frequency signal is controlled with the control circuit according to the frequency of the radio-frequency signal, and then the radio-frequency signal is amplified, so the amplification of a radio-frequency signal can be realized only by integrating one circuit including the plurality of oscillation loops in the radio frequency front end chip, thereby reducing the area of the radio frequency front end chip and improving the packaging utilization rate of the radio frequency front end chip.

Figure 12:
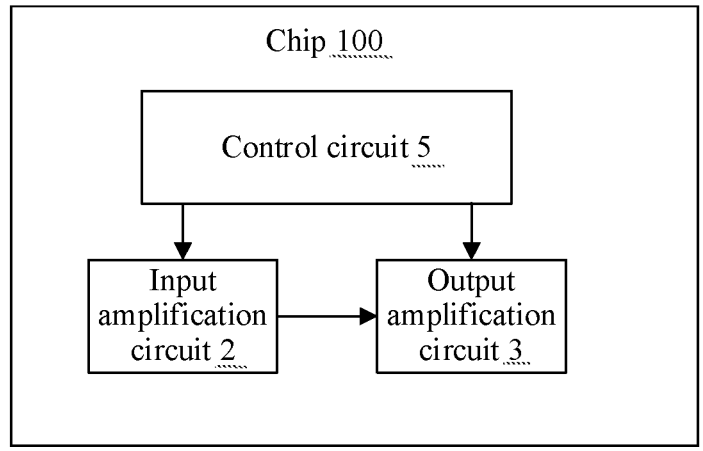
FIG. 12 is a schematic structural diagram of a chip provided by an embodiment of this disclosure.

FIG. 12 is the schematic structural diagram of the chip provided by an embodiment of this disclosure.

In the embodiment of the disclosure, a chip 100 integrates a control circuit 5, an input amplification circuit 2 and an output amplification circuit 3. Oscillation loops matched with different frequencies of radio-frequency signals in the chip 100 are integrated in one input amplification circuit 2, the control circuit 5 control the input amplification circuit 2 according to different frequencies to form the oscillation loops corresponding to the different frequencies, and then thereby a radio-frequency signal is amplified. There is no need to integrate amplifiers corresponding to different frequencies in the chip 100, so the area of the chip 100 is reduced.

Figure 13:
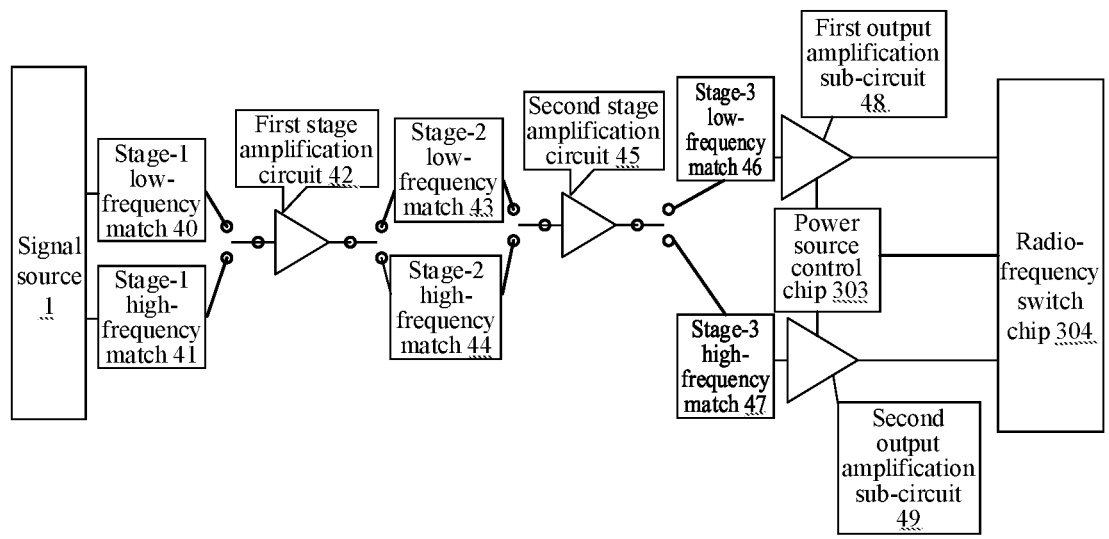
FIG. 13 is a structural diagram 11 of a reconfigurable high-integration radio-frequency amplifier provided by an embodiment of this disclosure.

FIG. 13 is the structural diagram 11 of the reconfigurable high-integration radio-frequency amplifier provided by an embodiment of this disclosure.

In the embodiment of the disclosure, the reconfigurable high-integration radio-frequency amplifier includes a power source control chip 303 and a radio-frequency switch chip 304. The signal source 1 is connected to a first end of a stage-1 low-frequency match 40 and a first end of a stage-1 high-frequency match 41. A second end of the stage-1 low-frequency match 40 and a second end of the stage-1 high-frequency match 41 are connected to a first end of a first stage amplification circuit 42. A second end of the first stage amplification circuit 42 is connected to a first end of a stage-2 low-frequency match 43 and a first end of a stage-2 high-frequency match 44. A second end of the stage-2 low-frequency match 43 and a second end of the stage-2 high-frequency match 44 are connected to a first end of a second stage amplification circuit 45. A second end of the stage-2 amplification circuit 45 is connected with a first end not shown in the drawing of a stage-3 low-frequency match 46 and a first end of a stage-3 high-frequency match 47. A second end of the stage-3 low-frequency match 46 is connected to a first end of a first output amplification sub-circuit 48. A second end of the stage-3 high-frequency match 47 is connected to a first end of a second output amplification sub-circuit 49. A second end of the first output amplification sub-circuit 48 and a second end of the second output amplification sub-circuit 49 are connected to a second end of the radio-frequency switch chip 304.

When the signal source 1 emits a low-frequency radio-frequency signal, the power source control chip 303 emits control signals to the stage-1 low-frequency match 40, the stage-2 low-frequency match 43 and the stage-3 low-frequency match 46 respectively according to the frequency of the low-frequency radio-frequency signal. The stage-1 low-frequency match 40, the stage-2 low-frequency match 43 and the stage-3 low-frequency match 46 are connected to the first stage amplification circuit 42, the second stage amplification circuit 45 and the first output amplification sub-circuit 48 in a conductive manner respectively, in response to the control signals. The low-frequency radio-frequency signal is amplified by the first stage amplification circuit 42, the second stage amplification circuit 45 and the first output amplification sub-circuit 48 step by step, thereby realizing the amplification of the low-frequency radio-frequency signal. In addition, since only one multi-stage amplification circuit corresponding to different frequencies of radio-frequency signals is arranged in the reconfigurable high-integration radio-frequency amplifier, the reconfigurable high-integration radio-frequency amplifier occupies a smaller area, thereby improving the packaging utilization rate of the chip.

Figure 14:
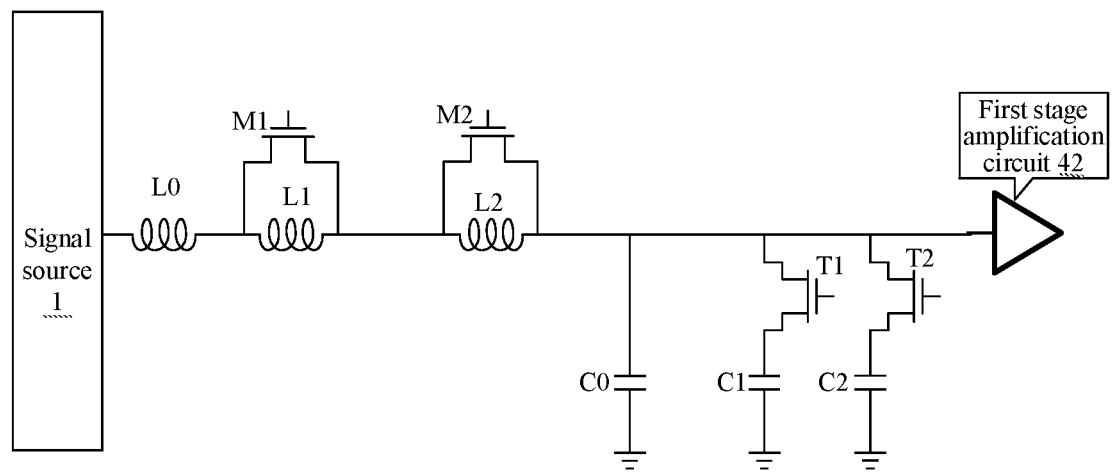
FIG. 14 is a structural diagram of a stage-1 matching circuit provided by an embodiment of this disclosure.

Please refer to FIG. 14, which is the structural diagram of a stage-1 matching circuit provided by an embodiment of this disclosure.

The stage-1 matching circuit provided by the embodiment of this disclosure includes an inductor L0, an inductor L1, an inductor L2, a field effect transistor M1, a field effect transistor M2, a field effect transistor T1, a field effect transistor T2, a capacitor C0, a capacitor C1 and a capacitor C2.

The inductor L0, the inductor L1 and the inductor L2 are connected in series successively. A first end of the inductor L0 is connected to one end of the signal source, and a second end of the inductor L2 is connected to the first end of the first stage amplification circuit 42. The field effect transistor M1 is connected in parallel to the inductor L1, and the field effect transistor M2 is connected in parallel to the inductor L2. The capacitor C0, the capacitor C1 and the capacitor C2 are successively connected in parallel, and first ends of the capacitor C0, the capacitor C1 and the capacitor C2 are respectively connected at the junction of the second end of inductor L2 and the first stage amplification circuit 42. The field effect transistor T1 is connected in parallel to the capacitor C1, and the field effect transistor T2 is connected in parallel to the capacitor C2.

Referring to FIG. 13, third ends of the field effect transistor M1, the field effect transistor M2, the field effect transistor T1 and the field effect transistor T2 are connected to the power source control chip 303.

When the signal source 1 emits the low-frequency radio-frequency signal, the power source control chip 303 emits the control signals to the third end of the field effect transistor M2 and the third end of the field effect transistor T1 respectively according to the frequency of the low-frequency radio-frequency signal. The field effect transistor M2 is turned on, and the field effect transistor T1 is turned on. Furthermore, an oscillation loop including the inductor L0, the inductor L1, the capacitor C0 and the capacitor C1 is formed. The low-frequency radio-frequency signal forms oscillation through the oscillation loop, and then forms a matching signal, and the matching signal is sent to the first stage amplification circuit 42 for a first stage amplification.

Various embodiments of the present disclosure provide a reconfigurable high-integration radio-frequency amplifier and a chip, which can have one or more of the following advantages.

When a signal source sends a radio-frequency signal to an input amplification circuit, a control circuit sends a first control signal to the input amplification circuit according to the frequency of the radio-frequency signal, and the input amplification circuit receives the first control signal and forms an input oscillation loop, and the radio-frequency signal forms an amplified first signal by the input oscillation loop, and the input amplification circuit sends the first signal to an output amplification circuit. According to the frequency of the radio-frequency signal, the control circuit transmits a second control signal to the output amplification circuit. Under the action of the second control signal, the output amplification circuit forms an output oscillation loop matched with the first signal. The first signal is amplified by the output oscillation loop to form an emitting signal, and output amplification circuit transmits the emitting signal to emitting antenna for emitting, thereby improving the utilization ratio of the radio-frequency front end chip package.

Various modifications of, and equivalent acts corresponding to, the disclosed aspects of the example embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

What is claimed is:

1. A reconfigurable high-integration radio-frequency amplifier, comprising: a signal source, a control circuit, an input amplification circuit, an output amplification circuit and an emitting antenna;
   wherein
   a first end of the input amplification circuit is connected to the signal source, and a second end of the input amplification circuit is connected to a first end of the output amplification circuit, and a second end of the output amplification circuit is connected to the emitting antenna, and one end of the control circuit is connected to a third end of the input amplification circuit and a third end of the output amplification circuit;
   when the signal source transmits a radio-frequency signal to the input amplification circuit, the control circuit transmits a first control signal to the input amplification circuit according to a frequency of the radio-frequency signal, and the input amplification circuit forms an input oscillation loop matched with the radio-frequency signal under an action of the first control signal, and the radio-frequency signal forms a first signal through the input oscillation loop, and the input amplification circuit transmits the first signal to the output amplification circuit;
   the control circuit transmits a second control signal to the output amplification circuit according to the frequency of the radio-frequency signal, the output amplification circuit forms an output oscillation loop matched with the first signal under an action of the second control signal, the first signal is amplified through the output oscillation loop to form an emitting signal, and the emitting signal is emitted through the emitting antenna;
   the input amplification circuit comprises an input matching circuit and an intermediate amplification circuit, and the first control signal comprises an input control signal and an intermediate amplification control signal, and a first end of the input matching circuit is connected to the signal source, and a second end of the input matching circuit is connected to a first end of the intermediate amplification circuit, and a second end of the intermediate amplification circuit is connected to the first end of the output amplification circuit;
   when the signal source transmits the radio-frequency signal to the input matching circuit, the control circuit acquires a behavior signal of a target object of the reconfigurable high-integration radio-frequency amplifier, and the control circuit transmits the input control signal to the input matching circuit based on the behavior signal, and the input matching circuit forms the input oscillation loop matched with the radio-frequency signal under an action of the input control signal;
   the radio-frequency signal forms oscillation through the input oscillation loop, and then forms a first matching signal, and the first matching signal is transmitted to the intermediate amplification circuit;
   based on the behavior signal, the control circuit sends the intermediate amplification control signal to the intermediate amplification circuit, and the intermediate amplification circuit amplifies the first matching signal to form the first signal under an action of the intermediate amplification control signal, and the first signal is transmitted to the output amplification circuit;
   the input matching circuit comprises m field effect transistors, m inductors and a first capacitor, and m is a positive integer greater than 1;
   the m inductors are connected in series successively, and first ends of the m field effect transistors are connected to the signal source respectively, and a second end of the m field effect transistors are connected to a first end of the m inductors, and a second end of an i-th inductor is connected to a second end of an (i+1)-th field effect transistor, and a second end of the m-th inductor is connected to a first end of the first capacitor, and a second end of the first capacitor is connected to the first end of the intermediate amplification circuit, and i is a positive integer greater than or equal to 1 and less than m;
   third ends of the m field effect transistors are connected to one end of the control circuit respectively;

when the signal source transmits the radio-frequency signal to the input matching circuit, the control circuit transmits the input control signal to an n-th field effect transistor;

the n-th field effect transistor is turned on under the action of the input control signal, and forms the input oscillation loop comprising the n-th field effect transistor, m-n+1 inductors and the first capacitor; and the radio-frequency signal flows through the input oscillation loop and forms the first matching signal, and the first matching signal is transmitted to the intermediate amplification circuit, and n is a positive integer greater than or equal to 1 and less than or equal to m.

2. The reconfigurable high-integration radio-frequency amplifier according to claim 1, wherein the intermediate amplification circuit comprises an intermediate amplifier and a feedback circuit;

a first end of the intermediate amplifier is grounded, and a third end of the intermediate amplifier is connected to a first end of the feedback circuit and then connected to the second end of the input matching circuit, and a second end of the feedback circuit is connected to a second end of the intermediate amplifier, and the second end of the intermediate amplifier is connected to the first end of the output amplification circuit;

a third end of the feedback circuit is connected to one end of the control circuit;

the first matching signal is shunted at a junction of the intermediate amplifier and the feedback circuit, forming an amplified matching signal and a feedback matching signal, and the amplified matching signal is transmitted to the third end of the intermediate amplifier for amplification to form the first signal, and the first signal is transmitted to the output amplification circuit, and the feedback matching signal is transmitted to the first end of the feedback circuit; and the control circuit transmits the intermediate amplification control signal to the third end of the feedback circuit, and the feedback circuit converts the feedback matching signal into a negative feedback signal under the action of the intermediate amplification control signal, and the negative feedback signal and the first matching signal are matched and cancelled.

3. A reconfigurable high-integration radio-frequency amplifier, comprising: a signal source, a control circuit, an input amplification circuit, an output amplification circuit and an emitting antenna;

wherein a first end of the input amplification circuit is connected to the signal source, and a second end of the input amplification circuit is connected to a first end of the output amplification circuit, and a second end of the output amplification circuit is connected to the emitting antenna, and one end of the control circuit is connected to a third end of the input amplification circuit and a third end of the output amplification circuit;

when the signal source transmits a radio-frequency signal to the input amplification circuit, the control circuit transmits a first control signal to the input amplification circuit according to a frequency of the radio-frequency signal, and the input amplification circuit forms an input oscillation loop matched with the radio-frequency signal under an action of the first control signal, and the radio-frequency signal forms a first signal through the input oscillation loop, and the input amplification circuit transmits the first signal to the output amplification circuit; and the control circuit transmits a second control signal to the output amplification circuit according to the frequency of the radio-frequency signal, the output amplification circuit forms an output oscillation loop matched with the first signal under an action of the second control signal, the first signal is amplified through the output oscillation loop to form an emitting signal, and the emitting signal is emitted through the emitting antenna;

the input amplification circuit comprises an input matching circuit and an intermediate amplification circuit, and the first control signal comprises an input control signal and an intermediate amplification control signal, and a first end of the input matching circuit is connected to the signal source, and a second end of the input matching circuit is connected to a first end of the intermediate amplification circuit, and a second end of the intermediate amplification circuit is connected to the first end of the output amplification circuit;

when the signal source transmits the radio-frequency signal to the input matching circuit, the control circuit acquires a behavior signal of a target object of the reconfigurable high-integration radio-frequency amplifier, and the control circuit transmits the input control signal to the input matching circuit based on the behavior signal, and the input matching circuit forms the input oscillation loop matched with the radio-frequency signal under an action of the input control signal;

the radio-frequency signal forms oscillation through the input oscillation loop, and then forms a first matching signal, and the first matching signal is transmitted to the intermediate amplification circuit;

based on the behavior signal, the control circuit sends the intermediate amplification control signal to the intermediate amplification circuit, and the intermediate amplification circuit amplifies the first matching signal to form the first signal under an action of the intermediate amplification control signal, and the first signal is transmitted to the output amplification circuit;

the intermediate amplification circuit comprises an intermediate amplifier and a feedback circuit;

a first end of the intermediate amplifier is grounded, and a third end of the intermediate amplifier is connected to a first end of the feedback circuit and then connected to the second end of the input matching circuit, and a second end of the feedback circuit is connected to a second end of the intermediate amplifier, and the second end of the intermediate amplifier is connected to the first end of the output amplification circuit;

a third end of the feedback circuit is connected to one end of the control circuit;

the first matching signal is shunted at a junction of the intermediate amplifier and the feedback circuit, forming an amplified matching signal and a feedback matching signal, and the amplified matching signal is transmitted to the third end of the intermediate amplifier for amplification to form the first signal, and the first signal is transmitted to the output amplification circuit, and the feedback matching signal is transmitted to the first end of the feedback circuit;

the control circuit transmits the intermediate amplification control signal to the third end of the feedback circuit, and the feedback circuit converts the feedback matching signal into a negative feedback signal under the action of the intermediate amplification control signal, and the negative feedback signal and the first matching signal are matched and cancelled;

the feedback circuit comprises a second capacitor, h resistors and 2 (h−1) field effect transistors, and h is a positive integer greater than 1;

the h resistors are connected in parallel, a first end of the second capacitor is connected to the second end of the input matching circuit, a second end of the second capacitor is connected to first ends of the h resistors respectively, a second end of a first resistor is connected to the second end of the intermediate amplifier, and two ends of other h−1 resistors except the first resistor are respectively connected to one field effect transistor; and the feedback matching signal is transmitted to the first end of the second capacitor through the junction between the intermediate amplifier and the feedback circuit, the control circuit transmits the intermediate amplification control signal to a number of z field effect transistors in the feedback circuit, the z field effect transistors are turned on under the action of the intermediate amplification control signal, forming a negative feedback circuit comprising the z field effect transistors and z/2 resistors correspondingly connected, and the feedback matching signal is converted into the negative feedback signal through the negative feedback circuit.

4. The reconfigurable high-integration radio-frequency amplifier according to claim 3, wherein the intermediate amplification circuit further comprises a t-stage intermediate amplification circuit, a (t−1)-stage intermediate matching circuit and t-1 inductors, and t is a positive integer greater than 1;

the second end of the input matching circuit is connected to a first end of a first stage intermediate amplification circuit, and a second end of the first stage intermediate amplification circuit is connected to a first end of a first stage intermediate matching circuit and a first end of a first inductor;

a first end of a k-th stage intermediate amplification circuit is connected to a second end of a (k−1)-th stage intermediate matching circuit, and a second end of the k-th stage intermediate amplification circuit is connected to a first end of a k-th stage intermediate matching circuit and a first end of a k-th inductor, and k is a positive integer greater than 1 and less than t;

a first end of a t-th stage intermediate amplification circuit is connected to a second end of a (t−1)-th stage intermediate matching circuit, and a second end of the t-th stage intermediate amplification circuit is connected to the first end of the output amplification circuit;

one end of the control circuit is connected to-the a third end of the input matching circuit, a third end of the t-stage intermediate amplification circuit, a third end of the (t−1)-stage intermediate matching circuit and second ends of the t−1 inductors; and the radio-frequency signal is converted into the first signal through the input matching circuit, the t-stage intermediate amplification circuit, the (t−1)-stage intermediate matching circuit and the t−1 inductors, and then transmitted to the output amplification circuit.

5. The reconfigurable high-integration radio-frequency amplifier according to claim 4, wherein the k-th stage intermediate matching circuit comprises a third capacitor, a fourth capacitor, a first field effect transistor, a field effect transistors and 2a capacitors;

a first end of the third capacitor is connected to a first end of the fourth capacitor, and the first end of the third capacitor is connected to the second end of the k-th stage intermediate amplification circuit, and a second end of the third capacitor is connected to a first end of the first field effect transistor, and a second end of the first field effect transistor is grounded, and the a field effect transistors are connected in parallel and then connected to two ends of the fourth capacitor, and the 2a capacitors are respectively connected to two ends of the a field effect transistors, two ends of each field effect transistor are respectively connected to one capacitor, and a second end of a 2a-th capacitor is connected to a first end of a (k+1)-th stage intermediate amplification circuit;

a third end of the first field effect transistor and third ends of the a field effect transistors are connected to one end of the control circuit;

a k-stage signal is shunted at the junction of the third capacitor and the fourth capacitor to form a first oscillation signal and a second oscillation signal, and the first oscillation signal is transmitted to the first end of the third capacitor, and the control circuit transmits a k-th intermediate matching control signal to the third end of the first field effect transistor, and the first field effect transistor is turned on under an action of the k-th intermediate matching control signal, and the first oscillation signal is transmitted to a ground line;

the control circuit transmit the k-th intermediate matching control signal to b field effect transistors in the a field effect transistors;

the b field effect transistors are turned on under the action of the k-th intermediate matching control signal, and forms an amplification oscillation loop comprising b field effect transistors, 2b capacitors, the third capacitor and the fourth capacitor; and the k-stage signal forms oscillation through the amplification oscillation loop, and then a k-th matching signal is formed and transmitted to the (k+1)-th stage intermediate amplification circuit until a (t−1)-th matching signal is transmitted to the t-th stage intermediate amplification circuit.

6. The reconfigurable high-integration radio-frequency amplifier according to claim 5, wherein the output amplification circuit comprises a number of m output amplification sub-circuits; and first ends of the m output amplification sub-circuits are connected to the second end of the intermediate amplification circuit respectively;

the control circuit transmits the second control signal to an n-th output amplification sub-circuit in the m output amplification sub-circuits based on the behavior signal; and the n-th output amplification sub-circuit is turned on under the action of the second control signal and forms the output oscillation loop, and the first signal forms oscillation through the output oscillation loop, and then the emitting signal is formed and transmitted to the emitting antenna.

7. The reconfigurable high-integration radio-frequency amplifier according to claim 6, wherein the n-th output amplification sub-circuit comprises a second field effect transistor, a first coil, a fifth capacitor and an n-th amplification circuit; and the second control signal comprises m output control signals;

a first end of the second field effect transistor is connected to the second end of the intermediate amplification circuit, and a second end of the second field effect transistor is connected to a first end of the first coil, and a second end of the first coil is connected to a first end of the fifth capacitor, and a second end of the fifth capacitor is connected to a first end of the n-th amplification circuit, and the second end of the amplification circuit is connected to one end of the emitting antenna;

the control circuit is connected to a third end of the second field effect transistor and a third end of the n-th amplification circuit;

the control circuit transmits an n-th output control signal to the second field effect transistor, the second field effect transistor is turned on under an action of the n-th output control signal, and the first signal is transmitted to the n-th amplification circuit; and the n-th amplification circuit amplifies the first signal under the action of the n-th output control signal to form the emitting signal, and transmits the emitting signal to the emitting antenna.

8. A chip integrated with the reconfigurable high-integration radio-frequency amplifier according to claim 1.

9. The chip according to claim 8, wherein when the input amplification circuit receives other frequencies of the radio-frequency signals, the input amplification circuit is configured to also respond to the first control signal and form the input oscillation loop matched with the other frequencies of the radio-frequency signals, and the reconfigurable high-integration radio-frequency amplifier is configured to form the oscillation loop corresponding to the frequency of the radio-frequency signal, and then amplify the radio-frequency signal.

10. The chip according to claim 9, wherein amplification of radio-frequency signal is realized only by integrating one amplification circuit including a plurality of oscillation loops in a radio frequency front end chip, thereby reducing an area of the chip and improving packaging utilization rate of the chip.

* * * * *